United States Patent
Zhang et al.

(10) Patent No.: US 10,873,042 B2
(45) Date of Patent: Dec. 22, 2020

(54) FLEXIBLE DISPLAY PANEL AND METHOD OF MANUFACTURING THE SAME

(71) Applicant: BOE TECHNOLOGY GROUP CO., LTD., Beijing (CN)

(72) Inventors: Jiahao Zhang, Beijing (CN); Penghao Gu, Beijing (CN); Paoming Tsai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/410,471

(22) Filed: May 13, 2019

(65) Prior Publication Data

US 2020/0083468 A1 Mar. 12, 2020

(30) Foreign Application Priority Data

Sep. 11, 2018 (CN) .......................... 2018 1 1058508

(51) Int. Cl.
*H01L 21/00* (2006.01)
*H01L 51/00* (2006.01)
*H01L 51/56* (2006.01)
*H01L 27/32* (2006.01)

(52) U.S. Cl.
CPC .......... *H01L 51/0097* (2013.01); *H01L 51/56* (2013.01); *H01L 27/3244* (2013.01); *H01L 2227/323* (2013.01); *H01L 2251/5338* (2013.01)

(58) Field of Classification Search
CPC .. H01L 51/0097; H01L 51/56; H01L 27/3244
See application file for complete search history.

(56) References Cited

U.S. PATENT DOCUMENTS

| | | | | |
|---|---|---|---|---|
| 5,201,451 A | * | 4/1993 | Desai | H01L 23/4985 228/44.7 |
| 6,103,554 A | * | 8/2000 | Son | H01L 23/3107 438/126 |
| 6,235,555 B1 | * | 5/2001 | Cho | G06K 19/07747 438/112 |
| 9,230,467 B2 | * | 1/2016 | Chen | H05K 1/028 |

(Continued)

FOREIGN PATENT DOCUMENTS

| CN | 105633281 A | 6/2016 |
|---|---|---|
| CN | 105690971 A | 6/2016 |

(Continued)

OTHER PUBLICATIONS

First Chinese Office Action dated Mar. 12, 2020, received for corresponding Chinese Application No. 201811058508.1, 12 pages.

*Primary Examiner* — Laura M Menz
(74) *Attorney, Agent, or Firm* — Kinney & Lange, P.A.

(57) ABSTRACT

The present disclosure provides a flexible display panel and a method of manufacturing the same. The method includes: manufacturing a flexible substrate; performing a cutting at a position between at least two adjacent flexible chip bonding regions to form a strip slit or hollowed region to structurally separate and space the at least two adjacent flexible chip bonding regions; attaching a backing film and cutting away a portion of the back film at the position corresponding to the strip slit or hollowed region; and bonding a flexible chip with a printed circuit on the flexible chip. Embodiments of the present disclosure also provide a flexible display panel.

12 Claims, 7 Drawing Sheets

(56) References Cited

U.S. PATENT DOCUMENTS

| | | | |
|---|---|---|---|
| 10,109,810 B2 | 10/2018 | Wang | |
| 10,164,213 B2* | 12/2018 | Chen | H01L 25/50 |
| 10,186,490 B2* | 1/2019 | He | H05K 3/0052 |
| 10,506,718 B2 | 12/2019 | Zhao et al. | |
| 10,618,263 B2 | 4/2020 | Chen et al. | |
| 2001/0050846 A1* | 12/2001 | Cho | H05K 3/0052 |
| | | | 361/784 |
| 2004/0224598 A1* | 11/2004 | Tanaka | G02F 1/13452 |
| | | | 445/24 |
| 2007/0058124 A1 | 3/2007 | Chen | |
| 2012/0056859 A1* | 3/2012 | Chen | H05K 1/028 |
| | | | 345/204 |
| 2014/0146491 A1 | 5/2014 | Chan et al. | |
| 2016/0111485 A1* | 4/2016 | Chida | H01L 51/0097 |
| | | | 257/40 |
| 2016/0359137 A1* | 12/2016 | Chen | H01L 21/77 |
| 2017/0194579 A1 | 7/2017 | Wang | |
| 2017/0200681 A1* | 7/2017 | He | H05K 3/0052 |
| 2017/0215288 A1* | 7/2017 | Shi | H05K 1/189 |
| 2017/0222165 A1* | 8/2017 | Liu | G02F 1/133305 |
| 2017/0317301 A1* | 11/2017 | Xie | H01L 27/12 |
| 2018/0043178 A1* | 2/2018 | Iguchi | A61N 5/0616 |
| 2018/0086041 A1 | 3/2018 | Chen et al. | |
| 2018/0123059 A1* | 5/2018 | Yang | H01L 51/56 |
| 2018/0240852 A1* | 8/2018 | Chen | H01L 27/3258 |
| 2019/0116672 A1 | 4/2019 | Zhao et al. | |
| 2019/0157586 A1* | 5/2019 | Liu | H01L 51/0097 |
| 2019/0157623 A1* | 5/2019 | Qin | H01L 51/56 |
| 2019/0204657 A1* | 7/2019 | Hu | H01L 51/524 |
| 2019/0363282 A1* | 11/2019 | Bao | H01L 51/5237 |
| 2020/0083468 A1* | 3/2020 | Zhang | H01L 27/3276 |
| 2020/0144558 A1* | 5/2020 | Qin | G09F 9/301 |

FOREIGN PATENT DOCUMENTS

| | | |
|---|---|---|
| CN | 107564416 A | 1/2018 |
| CN | 107683020 A | 2/2018 |

* cited by examiner

FLEXIBLE DISPLAY PANEL AND METHOD OF MANUFACTURING THE SAME

CROSS-REFERENCE TO RELATED APPLICATION

This application claims the benefit of Chinese Patent Application No. 201811058508.1, entitled "a flexible display panel and a method of manufacturing the same," filed with the State Intellectual Property Office of China on Sep. 11, 2018, the whole disclosure of which is incorporated herein by reference.

BACKGROUND

Embodiments of the present disclosure relates to a display technology field, and particularly to a flexible display panel and a method of manufacturing the same.

Currently, with the development of organic light emitting diode (OLED) technology, the application of large-size flexible display panel on in-vehicle and foldable notebook computers is gradually on the agenda. Due to a large size, a single IC or flexible chip can no longer meet the demand.

In the process of manufacturing the flexible display panel, when a flexible substrate is attached with a back film, pads of the flexible substrate and the flexible chip may be misplaced, and thus circuits may be disconnected.

SUMMARY

Embodiments of the present disclosure provide a flexible display panel and a method of manufacturing the same, which at least solves problems non-alignment of bonding of a printed circuit on the flexible chip with a flexible chip due to non-even size of a flexible substrate and increases producing yield.

As an aspect, embodiments of the present disclosure provide a method of manufacturing a flexible display panel, the method comprising: manufacturing a flexible substrate comprising a display region and a bonding region for the flexible display panel, the bonding region comprising at least two flexible chip bonding regions; performing a cutting at a position between at least two adjacent flexible chip bonding regions to form a strip slit or hollowed region to structurally separate and space the at least two adjacent flexible chip bonding regions; attaching a backing film and cutting away a portion of the back film at the position corresponding to the strip slit or hollowed region; and bonding a flexible chip with a printed circuit on the flexible chip.

In an embodiment, the strip slit or hollowed region has a rectangular shape, a trapezoidal shape, a triangular shape, a circular shape or an elliptical shape.

In an embodiment, the manufacturing a flexible substrate comprises manufacturing the flexible substrate on a surface of a rigid substrate; and the method further includes: before attaching the back film, separating the rigid substrate and the flexible substrate by a laser lift-off process.

In an embodiment, the back film is sequentially attached, in a direction perpendicular to a direction in which the at least two flexible chip bonding regions are arranged, from the at least two flexible chip bonding regions towards a position located away from the at least two flexible chip bonding regions.

As an aspect, embodiments of the present disclosure provide a flexible display panel comprising: a display region and a bonding region; the bonding region includes at least two flexible chip bonding regions, and a strip slit or a hollowed region is formed between at least two adjacent flexible chip bonding regions such that the at least two adjacent flexible chip bonding regions are structurally separated and spaced from each other.

In an embodiment, the strip slit or the hollowed region has a rectangular shape, a trapezoidal shape, a triangular shape, a circular shape or an elliptical shape.

In an embodiment, the display region includes a flexible substrate and pixel units arranged in an array on the flexible substrate.

In an embodiment, the display region is a rectangular region, and the bonding region is an extended area formed outside a side of the rectangular region, wherein the side is any one of sides of the rectangular region.

In an embodiment, the at least two flexible chip bonding regions are arranged in order along an extending direction of the side, and each of the flexible chip bonding regions is enclosed and formed by a first side, a second side, a third side and a fourth side, wherein the second side is parallel to the first side, and the third side and the fourth side intersect the first side and the two sides and are opposite to each other.

In an embodiment, the third side and the fourth side are respectively curved or straight.

In an embodiment, the flexible display panel is an OLED display panel.

The present summary is provided only by way of example, and not limitation. Other aspects of the present disclosure will be appreciated in view of the entirety of the present disclosure, including the entire text, claims, and accompanying figures.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

The technical solutions in embodiments of the present disclosure are clearly and completely described in the following with reference to the accompanying drawings of the embodiments of the present disclosure. It is obvious that the described embodiments are only a part of the embodiments of the present disclosure, but not all of the embodiments. All other embodiments obtained by a person of ordinary skill in the art based on the embodiments of the present disclosure without departing from the inventive scope belong to the scope of the disclosure. The following are non-exclusive descriptions of possible embodiments of the present invention.

In the description of the present disclosure, it is to be understood that the term of "center", "upper", "lower", "front", "back", "left", "right", "vertical", "horizontal", "top", "bottom", "inside", "outside" or the like indicating an orientation or positional relationship is based on the orientation or positional relationship shown in the drawings, and is merely for the convenience of describing the present disclosure and simplifying the description, rather than indicating or implying the device or component referred be necessary to be in a particular orientation or be constructed and operated in a particular orientation, and thus is not to be construed as limiting the disclosure. In the description of the present disclosure, "a plurality of" means two or more unless otherwise stated.

In the process of manufacturing a flexible display panel, a back film is attached to the flexible substrate usually by means of rolling and attaching. As a pressure of the rolling is increased, stress accumulation occurs in the back film, a glue material and the flexible substrate, which leads to an expansion of the flexible substrate. A degree of the expansion increases non-linearly from the center to the two sides, so that the stress accumulation at the outer side is more serious, and the expansion force is increasing, thereby causing the size of the flexible substrate to be non-uniform. As a subsequent bonding process of a flexible chip is sensitive to change of dimension, problems of such as misalignment of the pads of the flexible substrate and the flexible chip, and disconnection of the circuit, when bonding, will be caused.

Especially, for a bonding process of multiple flexible chips, an uneven expansion may cause actual positions of the flexible chips to be inconsistent with its design positions, and thus affect the subsequent bonding of the flexible chips with the printed circuit on the flexible chips, which seriously affects the production yield.

Figure 1:
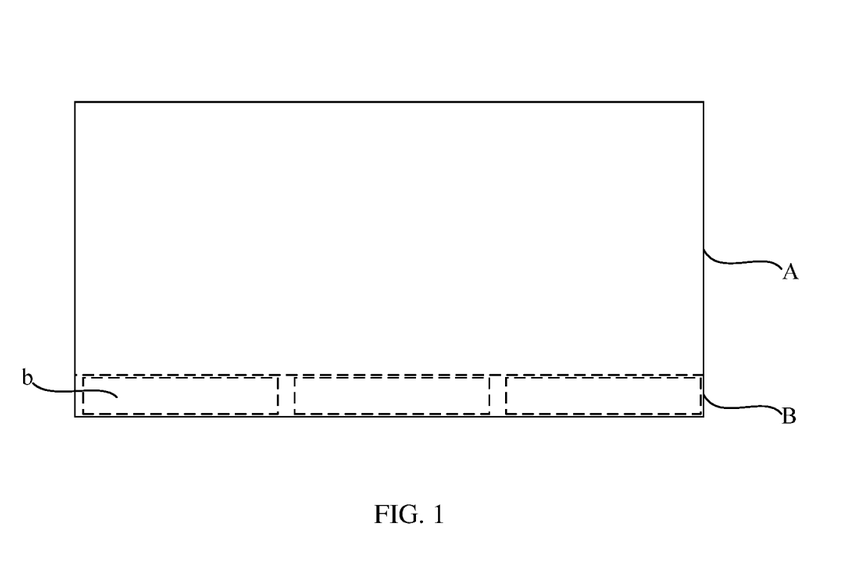
FIG. 1 is a schematic structural diagram of a flexible display panel according to an embodiment of the present disclosure.
Figure 2:
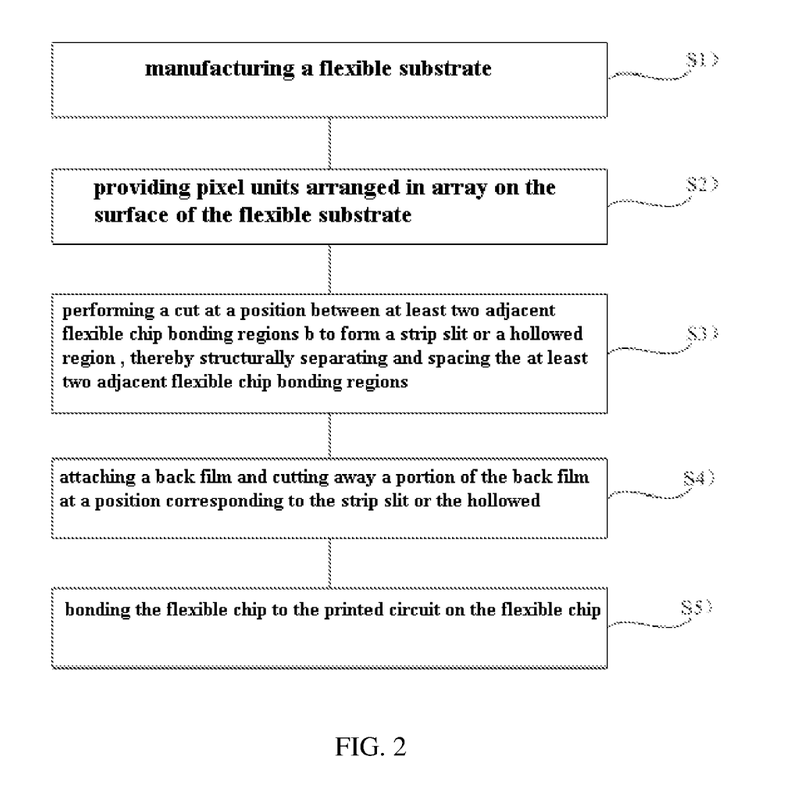
FIG. 2 is a schematic flow chart of a method of manufacturing a flexible display panel according to an embodiment of the present disclosure.
Figure 3:
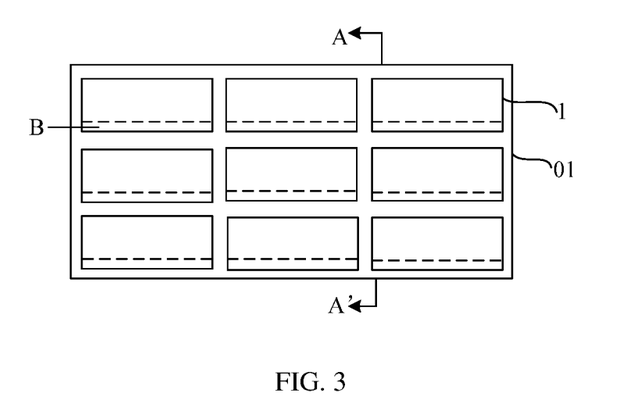
FIG. 3 is a schematic diagram of a flexible substrate according to an embodiment of the present disclosure.

Embodiments of the present disclosure provide a method of manufacturing a flexible display panel, the method including (see FIGS. 1 to 2): manufacturing a flexible substrate 1, as shown in FIG. 3, the flexible substrate including a display region A and a bonding region B for a flexible display panel, the bonding region B including at least two flexible chip bonding regions b, see FIG. 1. Herein, it is understood that the display region A and the bonding region B for a flexible display panel should be areas of the flexible substrate that will be processed as a display region and a bonding region of the flexible display panel when the manufacturing is finished.

The flexible substrate 1 can be manufactured on a rigid substrate 01. For example, a polyimide (PI) substrate can be manufactured on a rigid substrate 01 such as glass or stainless steel, and then the polyimide substrate is cut into a plurality of flexible substrate 1 by laser cutting. A plurality of flexible substrates 1, however, may be directly formed on the rigid substrate 01 such as glass or stainless steel.

Figure 4:
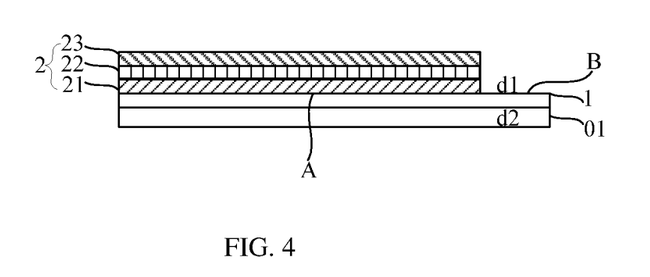
FIG. 4 is a schematic sectional diagram of a pixel unit, formed on a flexible substrate, along the A-A' direction in FIG. 3 according to an embodiment of the present disclosure.

In an embodiment, the surface of the flexible substrate 1 corresponding to the display region A is provided with pixel units 2 arranged in an array, as shown in FIG. 4.

The surface of the flexible substrate 1 corresponding to the display region A refers to the surface of the flexible substrate 1 facing the display region A as viewed from a front view direction.

In an embodiment, a TFT circuit 21 may be formed on the surface of the flexible substrate 1 corresponding to the display region A, an organic light-emitting layer 22 may be formed on a surface of the TFT circuit 21, and an encapsulation layer 23 of thin film may be formed on a surface of the organic light-emitting layer 22.

In an embodiment, the method further includes (referring to FIGS. 5-12): performing a cut at a position between at least two adjacent flexible chip bonding regions b to form a strip slit 31 (e.g., FIG. 8) or a hollowed region 32 (e.g., FIGS. 5-7), thereby structurally separating and spacing the at least two adjacent flexible chip bonding regions b.

In an embodiment, a cutting may be performed at the position between at least two adjacent flexible chip bonding regions b by laser cutting. Illustratively, the laser used may be a carbon dioxide laser, or a pulsed laser (picosecond or femtosecond).

A hollowed region 32 refers to an area that penetrates through an upper surface and a lower surface of the bonding region B (as shown by d1 and d2 in FIG. 4). Since the flexible chip bonding regions b may be two or three or more, there are various manners to perform the cutting at the position between the at least two adjacent flexible chip bonding regions b.

Figure 9:
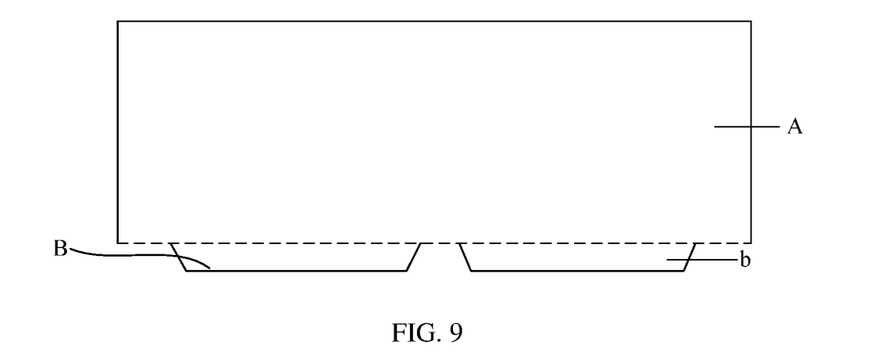
FIG. 9 is a schematic view showing a hollow area formed in a bonding region according to another embodiment of the present disclosure.

In an embodiment, referring to FIG. 9, a simple example is shown. In the embodiment, there are two flexible chip bonding regions b, and the cutting may be performed at the position between the two adjacent flexible chip bonding regions b, such that the two flexible chip bonding regions b are structurally separated and spaced and the bonding region B is discontinuous.

Figure 10:
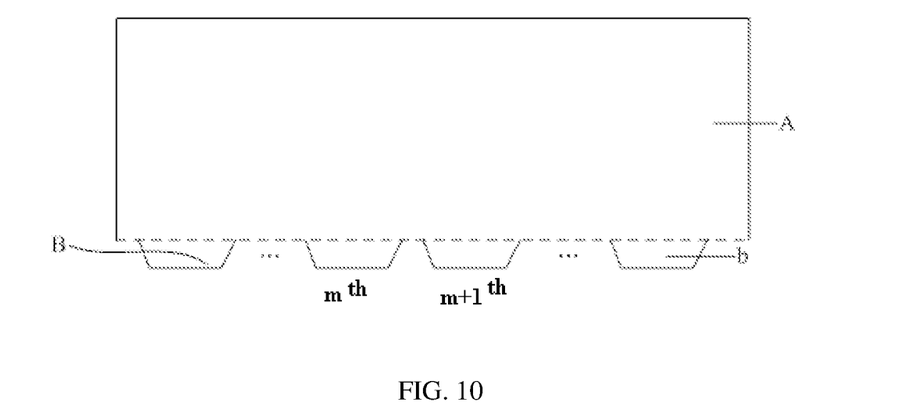
FIG. 10 is a schematic view showing a hollow area formed in a bonding region according to another embodiment of the present disclosure.
Figure 11:
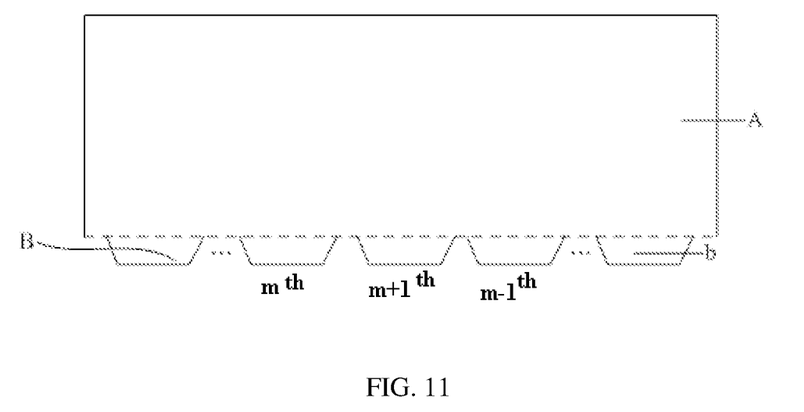
FIG. 11 is a schematic view showing a hollow area formed in a bonding region according to another embodiment of the present disclosure.
Figure 12:
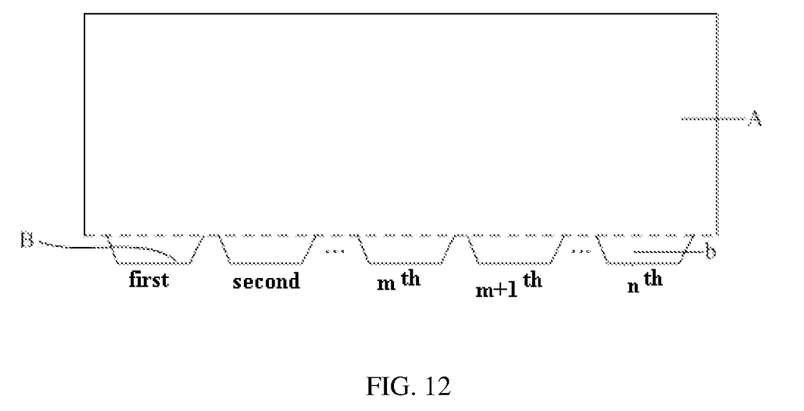
FIG. 12 is a schematic view showing a hollow area formed in a bonding region according to a further embodiment of the present disclosure.

According to an embodiment of the present disclosure, referring to FIGS. 10 to 12, there may be n flexible chip bonding regions b, where n is a natural number greater than or equal to 3.

In an embodiment, as shown in FIG. 10, the cutting is performed at the position between the mth and (m+1)th flexible chip bonding regions b of then flexible chip bonding regions b, such that only the mth and (m+1)th flexible chip bonding regions b are structurally separated and spaced and the bonding region B is discontinuous, or, as shown in FIG. 11, the cutting is performed at the position between the (m−1)th and mth flexible chip bonding regions b and the position between the mth and (m+1)th flexible chip bonding regions b such that the (m−1)th flexible chip bonding region b, the mth flexible chip bonding region b and the (m+1)th flexible chip bonding region b are structurally separated and spaced and the bonding region B is discontinuous.

In another embodiment, as shown in FIG. 12, the cutting may be performed at a position between each two adjacent flexible chip bonding regions b of the n flexible chip bonding regions b, such that the n flexible chip bonding regions b are structurally separated and spaced from one another, thereby making the bonding region B be discontinuous.

In an embodiment, the method may further include (refer to FIGS. 13 and 14): attaching a back film 4 and cutting away a portion of the back film 4 at a position corresponding to the strip slit 31 or the hollowed region 32.

Figure 15:
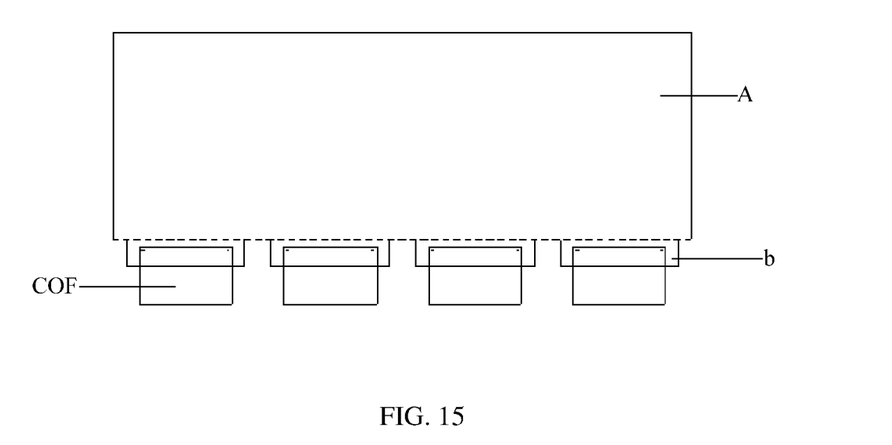
FIG. 15 is a schematic diagram of performing a flexible chip bonding according to an embodiment of the present disclosure.
Figure 16:
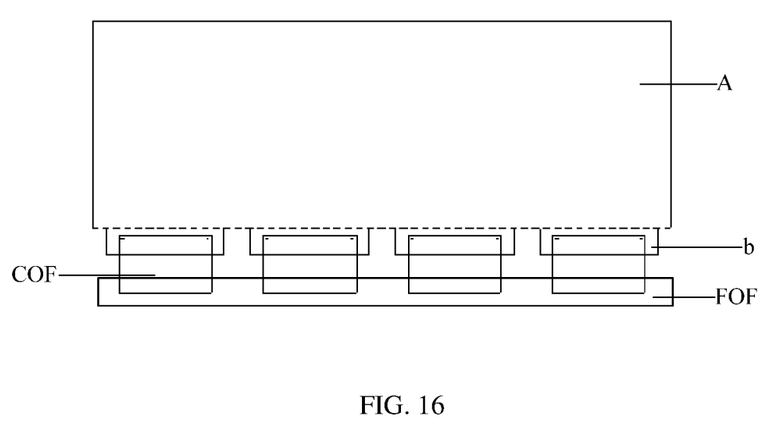
FIG. 16 is a schematic diagram of performing a bonding process of printed circuit on a flexible chip based on FIG. 15 according to an embodiment of the present disclosure.

In an embodiment, the method may further include (refer to FIGS. 15 and 16): bonding the flexible chip to the printed circuit on the flexible chip.

According to embodiments of the present disclosure, the method further includes: forming pixel units arranged in an array on a surface of the flexible substrate corresponding to the display region. The step of forming the pixel unit may be performed after the flexible substrate is manufactured and before the cutting is performed at the position/area between the adjacent flexible chip bonding regions. However, it should be understood that the pixel unit may be formed on the surface of the display region after the flexible chip bonding regions are structurally separated and spaced by performing the cutting at the position(s) between the adjacent flexible chip bonding regions.

Embodiments of the present disclosure provide a method of manufacturing a flexible display panel, in which the cutting is performed at the position(s) between at least two adjacent flexible chip bonding regions b to form a strip slit 31 or a hollowed region 32, such that the at least two adjacent flexible chip bonding regions b are structurally separated and spaced and thus the bonding region B is discontinuous. With such a configuration, when the back film is attached, since the back film contacts nothing at the strip slit 31 and the hollowed region 32, no forcing point is formed on the back film at the strip slit 31 and the hollowed region 32 during rolling, thereby limiting non-uniform expansion of the flexible substrate 1, facilitating accurate alignment in the subsequent flexible chip bonding process and the bonding process of a printed circuit on a flexible chip, and solving problem of inaccurate alignment in the flexible chip bonding process and the bonding process of a printed circuit on a flexible chip caused by the non-uniform size of the flexible substrate and thus problem of low yield.

Figure 5:
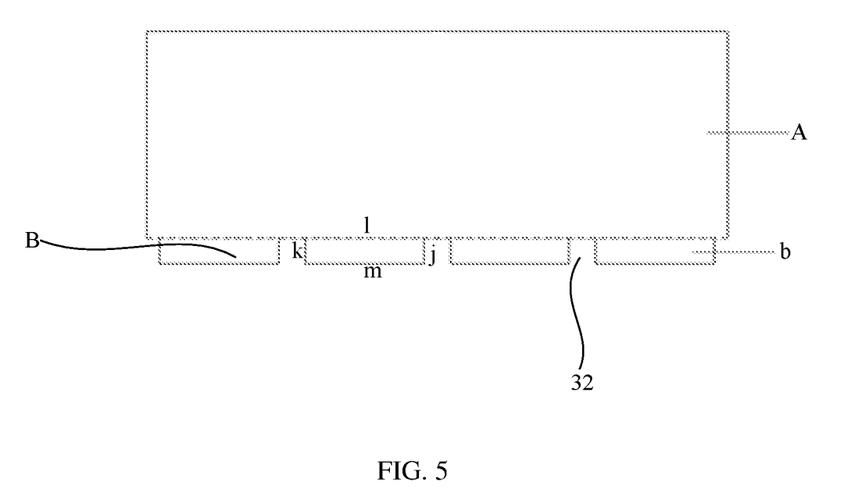
FIG. 5 is a schematic diagram of a hollow area formed in a bonding region according to an embodiment of the present disclosure.
Figure 6:
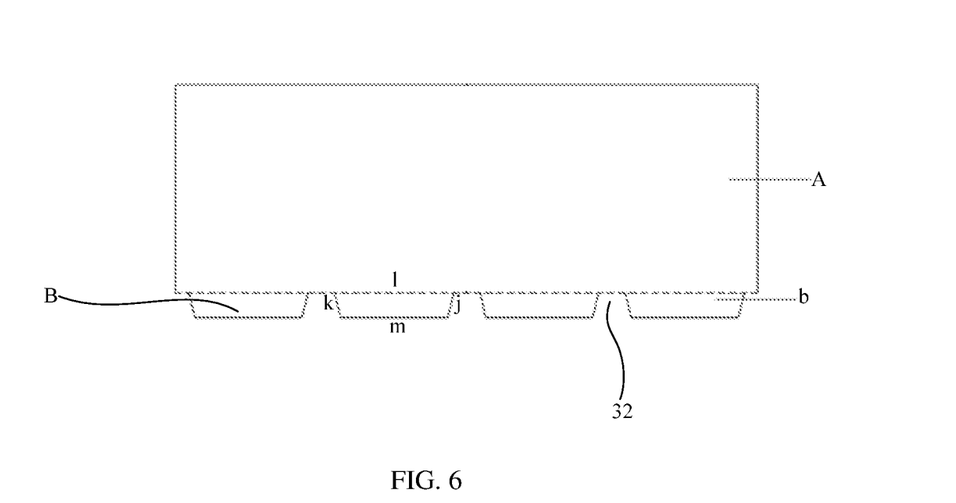
FIG. 6 is a schematic view showing a hollow area formed in a bonding region according to another embodiment of the present disclosure.
Figure 7:
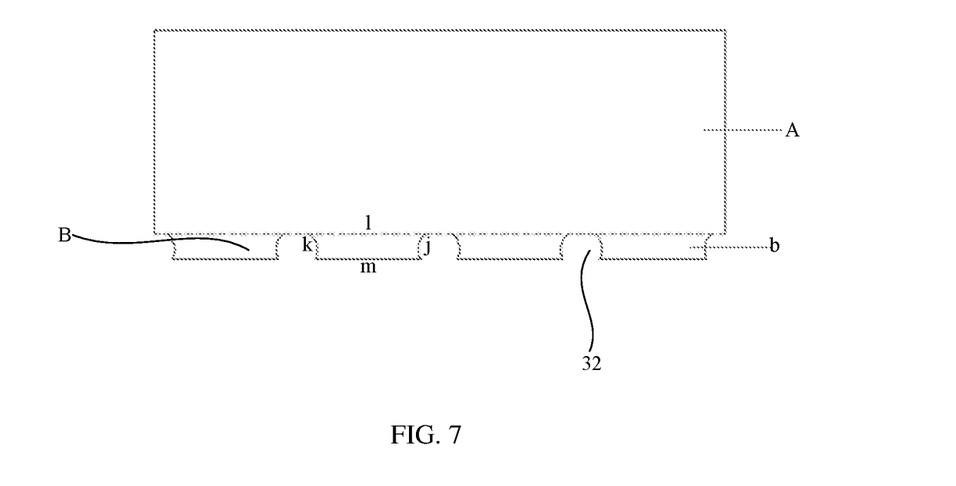
FIG. 7 is a schematic view showing a hollow area formed in a bonding region according to another embodiment of the present disclosure.
Figure 8:
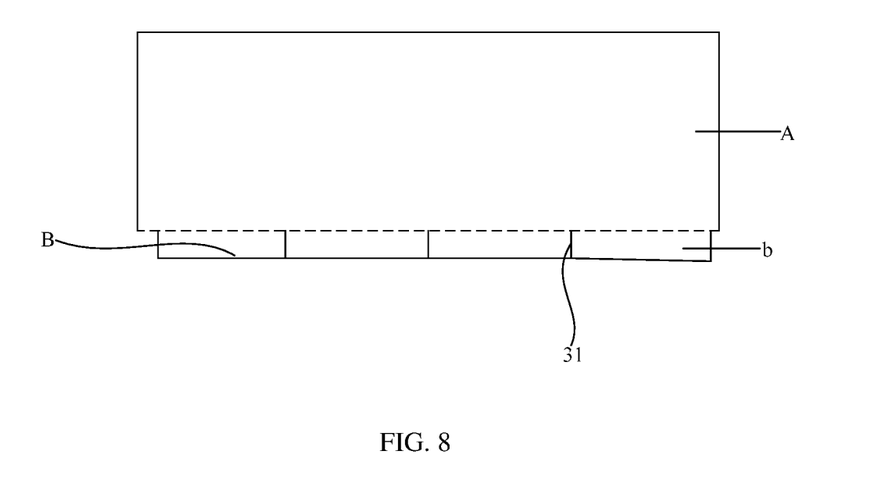
FIG. 8 is a schematic view showing a hollow area formed in a bonding region according to another embodiment of the present disclosure.

According to embodiments of the present disclosure, a shape of the slit or hollowed region 32 may be square (as shown in FIG. 5), trapezoidal (as shown in FIG. 6), triangular, circular, or elliptical (as shown in FIG. 7).

In an embodiment, when the flexible substrate 1 is manufactured on a rigid substrate 01, the method further includes separating the rigid substrate 01 from the flexible substrate 1 by a laser lift-off process before attaching the back film 4.

In the embodiments of the present disclosure, the attaching the back film 4 is not limited specifically. In practice, the back film 4 is usually attached in the longitudinal direction, that is, in the direction indicated by the arrow a in FIG. 14. Since the bonding region B is discontinuous, when the back film 4 is attached under the rolling, no forcing point for accumulating stress in the back film 4 is formed on the flexible substrate, between at least two adjacent flexible chip bonding regions b. Thus, it is impossible to cause uneven expansion of the flexible substrate, thereby achieving the purpose of limiting uneven expansion of the flexible substrate.

Figure 13:
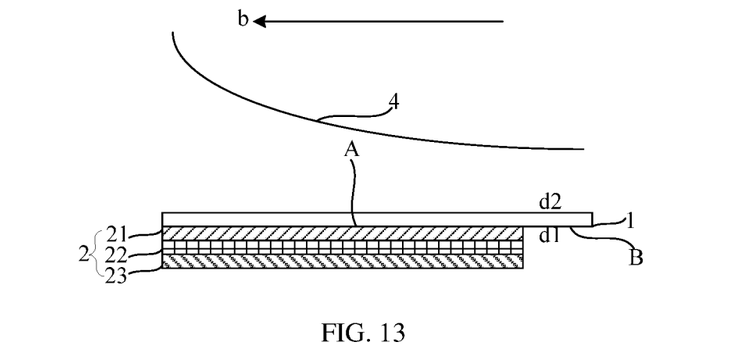
FIG. 13 is a schematic diagram for illustrating attaching a backing film according to an embodiment of the present disclosure.
Figure 14:
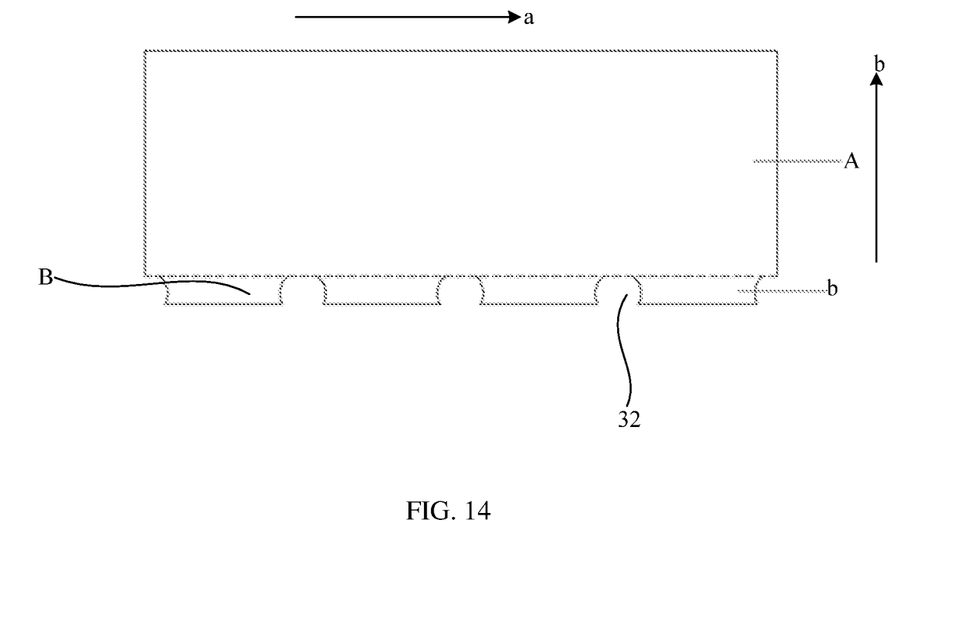
FIG. 14 is a schematic view for illustrating attaching a back film according to another embodiment of the present disclosure.

In an embodiment of the present disclosure, as shown in FIGS. 13 and 14, the attachment of the back film 4 is performed starting from the bonding region B in the direction away from the bonding region B, that is, in the direction perpendicular to the arrangement direction of the at least two flexible chip bonding regions b. The specific attachment direction is as shown by the arrow b in FIG. 13. The above attachment may further limit the uneven expansion of the bonding region B in the longitudinal direction (the direction indicated by the arrow a in FIG. 14), thereby facilitating subsequent bonding and improving the yield of the flexible chip and the bonding process of printed circuit on a flexible chip.

Embodiments of the present disclosure further provide a flexible display panel, see FIGS. 5-12, including: a display region A and a bonding region B; the bonding region B includes at least two flexible chip bonding regions b, and a strip-shaped slit 31 or a hollowed region 32 is formed between at least two adjacent flexible chip bonding regions b, such that the at least two adjacent flexible chip bonding regions b are structurally separated and spaced from each other. The strip-shaped slit 31 or the hollowed region 32 refers to a region penetrating through the upper and lower surfaces of the bonding region B (as shown by d1 and d2 in FIG. 4).

Since there may be two or three or more flexible chip bonding regions b in the bonding region B, the strip slit 31 or the hollowed region 32 may be formed between at least two adjacent flexible chip bonding regions b, and the present disclosure provides various embodiments in different structures.

In an embodiment, referring to FIG. 9, there are two flexible chip bonding regions b, and the strip-shaped slit 31 or the hollowed region 32 is formed between the two adjacent flexible chip bonding regions b, so as to separate and space the two flexible chip bonding regions b from each other.

According to an embodiment of the present disclosure, referring to FIGS. 10 to 12, there may be n flexible chip bonding regions b, where n is a natural number greater than or equal to 3. In an embodiment, as shown in FIG. 10, the strip slit 31 or the hollowed region 32 may be formed between the mth flexible chip bonding region b and (m+1)th flexible chip bonding regions b of the n flexible chip bonding regions b, separating and spacing the mth and (m+1)th flexible chip bonding regions b from each other, or, as shown in FIG. 11, the strip slits 31 or the hollowed regions 32 are respectively formed between the (m−1)th and mth flexible chip bonding regions b and between the mth and (m+1)th flexible chip bonding regions b, separating and spacing the (m−1)th flexible chip bonding region b, the mth flexible chip bonding region b and the (m+1)th flexible chip bonding region b from one another.

In an embodiment, referring to FIG. 12, the strip slits 31 or hollowed regions 32 may be formed between each two adjacent flexible chip bonding regions b of the n flexible chip bonding regions b, respectively, separating and spacing the n flexible chip bonding regions b from one another.

Embodiments of the present disclosure also provide a flexible display panel, in which at least two adjacent flexible chip bonding regions b are separated and spaced structurally from each other by forming the strip slit 31 or the hollowed region 32 between the at least two adjacent flexible chip bonding regions b such that the bonding region B is discontinuous. With such a configuration, when the back film is attached, since the back film contacts nothing in the strip slit 31 or the hollowed region 32, the back film is subject to no force point in the strip slit 31 or the hollowed region 32 at the time of rolling and an uneven expansion of the flexible substrate 1 can be limited, thereby facilitating accurate alignment of the subsequent flexible chip bonding and bonding process of printed circuit on a flexible chip, solving the problem of inaccurate alignment of the flexible chip bonding and bonding process of printed circuit on a flexible chip caused by non-uniform size of the flexible substrate and the problem of low yield.

According to embodiments of the present disclosure, the hollowed region 32 may have a shape of a square, a trapezoid, a triangle, a circle, or an ellipse.

In an embodiment of the present disclosure, referring to FIG. 4, the display region A includes a flexible substrate 1 and pixel units 2 arranged in an array on the flexible substrate 1.

In the embodiment of the present disclosure, the specific structures of the display region A and the bonding region B are not limited.

In an embodiment of the present disclosure, referring to FIGS. 5-7, the display region A is shown as a rectangular region, and the bonding region B is shown as an area formed outside a side of the rectangular region and extended along a length thereof. The first side may refer to any side of the rectangular region.

In an embodiment of the present disclosure, with continued reference to FIGS. 5-7, the at least two flexible chip bonding regions b are arranged in order along an extending direction of the side, and each of the flexible chip bonding regions b is enclosed and thus formed by the first side 1, a second side m, a third side k and a fourth side j. In the embodiment, the second side m is parallel to the first side 1, and the third side k and the fourth side j intersect the first side 1 and the second side m and are opposite to each other. In this way, cumulative stress applied to the bonding region B can be reduced, thereby avoiding uneven expansion and thus facilitating the subsequent bonding of the flexible chip and the printed circuit on the flexible chip.

In an embodiment, the third side k and the fourth side j are respectively curved or straight. In an embodiment, as shown in FIGS. 5 and 6, the hollowed regions 32 are rectangular or trapezoidal, in which the third side k and the fourth side j are straight lines. In an embodiment, the hollowed regions 32 are circular or elliptical (as shown in FIG. 7), and the third side k and the fourth side j are curved.

In still another embodiment of the present disclosure, the flexible display panel is an OLED display panel. In the embodiment, as shown in FIG. 4, the pixel unit 2 may include a TFT circuit 21 on a corresponding display region A of the flexible substrate 1, an organic light-emitting layer 22 on the TFT circuit 21, and a thin film encapsulation layer 23 on the organic light-emitting layer 22.

The above are only the specific embodiments of the present disclosure, but the scope of the present disclosure is not limited thereto, and any person skilled in the art can easily think of changes or substitutions within the technical scope of the disclosure. It should be covered within the protective scope of the present disclosure. Therefore, the scope of protection of the present disclosure should be subject to the scope of protection of the claims

The invention claimed is:

1. A method of manufacturing a flexible display panel, the method comprising:
    manufacturing a flexible substrate comprising a display region and a bonding region for the flexible display panel, the bonding region comprising at least two flexible chip bonding regions;
    performing a cutting at a position between at least two adjacent flexible chip bonding regions to form a strip slit or hollowed region so as to structurally separate and space the at least two adjacent flexible chip bonding regions;
    attaching a backing film and cutting away a portion of the back film at a position corresponding to the strip slit or hollowed region; and
    bonding a flexible chip and a printed circuit on the flexible chip.

2. The method of manufacturing a flexible display panel as claimed in claim 1, wherein
    the strip slit or hollowed region has a rectangular shape, a trapezoidal shape, a triangular shape, a circular shape or an elliptical shape.

3. A method of manufacturing a flexible display panel as claimed in claim 1, wherein
    the manufacturing a flexible substrate comprises manufacturing the flexible substrate on a surface of a rigid substrate; and
    the method further includes:
    before attaching the back film, separating the rigid substrate and the flexible substrate by a laser lift-off process.

4. The method of manufacturing a flexible display panel as claimed in claim 1, wherein
    the back film is sequentially attached, in a direction perpendicular to a direction in which the at least two flexible chip bonding regions are arranged, from the at least two flexible chip bonding regions towards a position located away from the at least two flexible chip bonding regions.

5. The method of manufacturing a flexible display panel as claimed in claim 1, wherein the method further comprises: forming pixel units arranged in an array on a surface of the flexible substrate corresponding to the display region.

6. A flexible display panel comprising:
    a display region and a bonding region;
    the bonding region includes at least two flexible chip bonding regions, and a strip slit or hollowed region is formed between at least two adjacent flexible chip bonding regions such that the at least two adjacent flexible chip bonding regions are structurally separated and spaced apart from each other.

7. The flexible display panel as claimed in claim 6, wherein
    the strip slit or hollowed region has a rectangular shape, a trapezoidal shape, a triangular shape, a circular shape or an elliptical shape.

8. The flexible display panel as claimed in claim 6, wherein the display region includes a flexible substrate and pixel units arranged in an array on the flexible substrate.

9. The flexible display panel as claimed in claim 6, wherein
the display region is a rectangular region, and the bonding region is an extended area formed outside a side of the rectangular region, wherein the side is any one of sides of the rectangular region.

10. The flexible display panel as claimed in claim 9, wherein
the at least two flexible chip bonding regions are arranged in order along an extending direction of the side, and each of the at least two flexible chip bonding regions is enclosed and formed by a first side, a second side, a third side and a fourth side, wherein the second side is parallel to the first side, and the third side and the fourth side intersect the first side and the two sides and are opposite to each other.

11. The flexible display panel as claimed in claim 10, wherein
the third side and the fourth side are respectively curved or straight.

12. The flexible display panel as claimed in claim 6, wherein
the flexible display panel is an OLED display panel.

* * * * *